United States Patent [19]

Stebbins

[11] 4,054,805

[45] Oct. 18, 1977

[54] ELECTRONIC SWITCHING DEVICE

[76] Inventor: Russell T. Stebbins, 112 Ferne St., Palo Alto, Calif. 94306

[21] Appl. No.: 640,450

[22] Filed: Dec. 15, 1975

[51] Int. Cl.[2] .......................................... H03K 19/00
[52] U.S. Cl. ................................. 307/251; 307/304; 307/308; 324/133
[58] Field of Search .............. 307/251, 257, 304, 279; 328/5; 324/149 P, 133; 340/248

[56] References Cited

U.S. PATENT DOCUMENTS

| | | | |
|---|---|---|---|
| 3,382,408 | 5/1968 | Atkins | 328/5 |
| 3,660,688 | 5/1972 | Evans et al. | 307/308 |
| 3,678,297 | 7/1972 | Takahashi | 307/251 |
| 3,848,108 | 11/1974 | Takarada | 307/251 |

FOREIGN PATENT DOCUMENTS

| | | | |
|---|---|---|---|
| 17,208 | 6/1965 | Japan | 307/251 |

*Primary Examiner*—Stanley D. Miller, Jr.
*Assistant Examiner*—B. P. Davies
*Attorney, Agent, or Firm*—Limbach, Limbach & Sutton

[57] ABSTRACT

A field effect transistor of the N junction, P junction, or MOS FET type and having a load connected in series with its source and drain electrodes is normally biased off by a diode circuit which causes the FET to conduct when an input voltage is applied to an input terminal of the diode means.

7 Claims, 9 Drawing Figures

ELECTRONIC SWITCHING DEVICE

BACKGROUND OF THE INVENTION

This invention relates to electronic switching devices, and more particularly to high and low level energy detection devices such as proximity switches.

Such energy detection devices typically have a sufficiently high input impedance so as not to bleed off the field potential of the object being measured. Such switches operate devices by merely being touched or coming within a certain proximity to an object having a predetermined potential with respect to the circuit ground of the switch. There are many disadvantages to existing FET proximity switch type devices. One such disadvantage is that in the typical such FET switch the FET must be biased all of the time in order to be operative. This consumes unnecessary power, even though the power consumed is relatively small. The consumption of any power requires a source, such as a battery or photocell, which further adds to the bulk and expense of the switch.

Furthermore, there is a need for an electronic switch which can be operated by and switch into alternating or direct current over a broad voltage range. Typically, such circuits have a relatively narrow operating voltage and current range for operation of the switch.

SUMMARY OF THE INVENTION

The above disadvantages of prior art electronic switches of the FET type are overcome by the present invention of an electronic switch, the switch comprising a high input impedance, field effect transistor (FET) having gate, source and drain electrodes, means for connecting the load in series with the source and drain electrodes, and diode input means having an input terminal, a circuit ground and being connected between the gate and source electrodes for normally making the FEY nonconductive by insuring that in the absence of an input signal between the input terminal and the circuit ground the source electrode is at least as positive as the gate electrode and for making the FET conductive when an input signal of a predetermined magnitude is applied between the input terminals and the circuit ground. In the preferred embodiment the FET is either a P channel enhancement mode metal oxide semiconductor (MOS), an N channel depletion mode MOS, or an N channel junction FET. The diode means comprise a resistor having a resistance in excess of 1 million ohms and connected at one end to the gate electrode of the FET and at the other end to a junction point. A first diode has its anode connected to the input terminal and its cathode connected to the junction point with the resistor. A capacitor having a capacitance not greater than 680 picofarads is connected between the junction point with the anode of the first diode and the resistor and the source electrode. A second diode is connected at its cathode to the anode of the first diode and at its anode to the end of the capacitor which is connected to the source electrode. In some embodiments an antenna is connected in series with a second capacitor to the input terminal for picking up electrical energy fields external to the switch.

Such external electrical energy filds are alternating current and are coupled through the second capacitor to the input terminal. The negative going alternating current is shunted to the circuit ground through the second diode and the positive going alternating current potential is coupled through the first diode and the high resistance to the gate electrode of the FET. The first capacitor is charged with the positive DC voltage causing a positive potential to exist at the gate of the FET. When this is accomplished the FET becomes conductive and the source to drain impedance is reduced to approximately 50 ohms, thus turning on the external load. When no external potential is applied to the antenna the positive charge on the first capacitor discharges through the first and second diodes using their reverse bias leakage characteristics. The gate electrode of the FET is then biased to an off condition and the source to drain impedance is again at an extremely high value turning off the load.

Where the energizable load requires a switching device capable of switching a relatively large current, a high current switching transistor is connected into the circuit so that the FET, when it becomes conductive, supplies the proper bias to the power switching transistor to make it conductive.

The electronic switch of the invention is capable of replacing conventional light switches, doorbell switches, television, radio and other appliance switches, dimmer switches, variable speed control switches, computer switches, and almost any other type of switch of the mechanical or electronic type. The electronic switching device of the invention can further be used to detect moving objects, such as moving magnetic tape, the position of a disc, or the position of a shaft. Furthermore, the circuit can be used to detect masses exhibiting differences of potential, such as the human body, etc.

In all of the above described applications for the electronic switch of the invention the circuit causes an impedance change between the source and drain electrodes with just the detected energy field applied to the input terminal. The switch of the invention does not require any external voltage sources in order to function. External power is only required to energize the load, such as lighting a light, closing a relay, etc.

The electronic switch of the invention may operate near zero volts source to drain potential up to the breakdown voltage of the FET.

It is therefore an object of the present invention to provide a solid state switch with no moving parts;

It is another object of the invention to provide a solid state switch to replace ordinary mechanical switches;

It is still another object of the invention to provide a solid state, electronic switch which requires no external energy source in order to function.

The foregoing and other objectives, features and advantages of the invention will be more readily understood upon consideration of the following detailed description of certain preferred embodiments of the invention, taken in conjunction with the accompanying drawings.

DETAILED DESCRIPTION OF CERTAIN PREFEERED EMBODIMENTS

Figure 1:
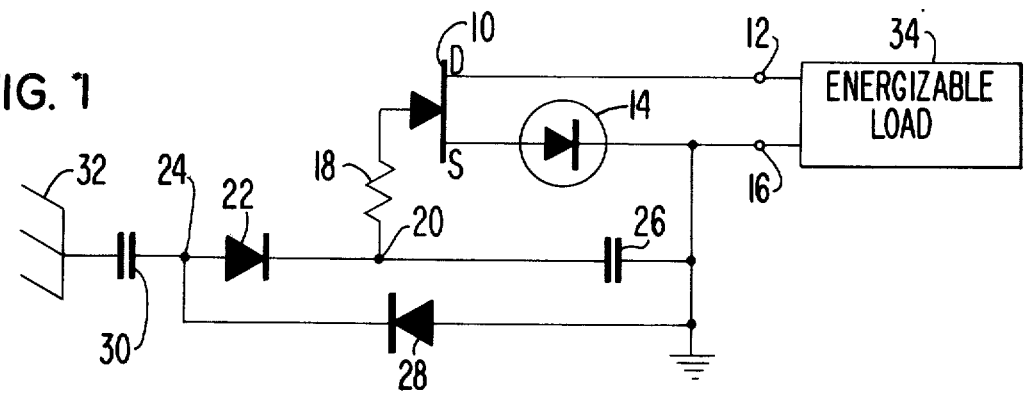
FIG. 1 is a schematic diagram of the basic electronic switch according to a preferred embodiment of the invention.

Referring now more particularly to FIG. 1 the basic electronic switching circuit of the invention is disclosed in which an N junction FET 10 is connected with its drain electrode to an output terminal 12 and its source electrode connected through an LED 14 to a second output terminal 16. The gate electrode of the FET 10 is connected in series with a high impedance resistor 18 to a junction point 20. The resistor 18 may have a resistance of at least 1 million ohms.

A first semiconductor diode 22 is connected at its cathode to the junction point 20 and at its anode to an input terminal 24. The junction 20 is also connected through a capacitor 26 to the output terminal 16 and to the circuit ground. A second diode 28 is connected at its anode to the circuit ground and the output terminal 16 and at its cathode to the input terminal 24. A second capacitor 30 is connected between the input terminal 24 and an antenna 32. In operation the circuit detects differences of potential existing external to the source of the FET. The antenna 32 can be used to pick up alternating current energy fields which are coupled through the capacitor 30 to the input terminal 24. Negative going alternating current is clamped to the circuit ground through the diode 28 and positive going alternating current passes through the diode 22 to charge the capacitor 26. Thus the alternating current has been rectified to direct current with the positive charge on the capacitor 26 being applied through the resistor 18 to the gate electrode of the FET 10. When this happens the source to drain impedance of the FET 10 becomes relatively low, approximately 50 ohms. An energizable load 34 connected in series with the terminals 12 and 16 will thus be turned on by virtue of the low impedance path through the FET 10 between its source and drain electrodes. The energizable load may take the form of, for example, a relay coil in series with a battery, a light in series with a battery, or, as will be described in further detail in reference to FIG. 2, a power switching transistor properly biased.

At the time the cause for the FET switching to its conductive state is removed, that is when no alternating current potential is detected by the antenna 32, the positive charge on the capacitor 26 discharges through the diodes 22 and 28 by virtue of their reverse bias leakage characteristics. When the capacitor 26 is completely discharged, the source electrode of the FET will be at a higher positive potential than the gate electrode by virtue of the diode circuit comprised of the diodes 22 and 28 and the LED 14. This will make the FET non-conductive and present a high source to drain impedance at the terminals 12 and 16, thus turning off the energizable load.

It should be pointed out at this point that because of the high impedance input to the circuit of FIG. 1 the energy levels may be sensed without discharging them to earth. The earth has an energy field around it, and this difference of potential varies with atmospheric conditions to below 100 volts per meter to over 2,000 volts per meter. In addition to a static voltage differential to earth proportional to altitude and inversely proportional to the pressure, thus A/E × P, there is also a broad band of frequency. By designing the proper rectification and filter circuit to the input of the FET, many other applications of the electronic switch of the invention will become apparent.

Figure 2:
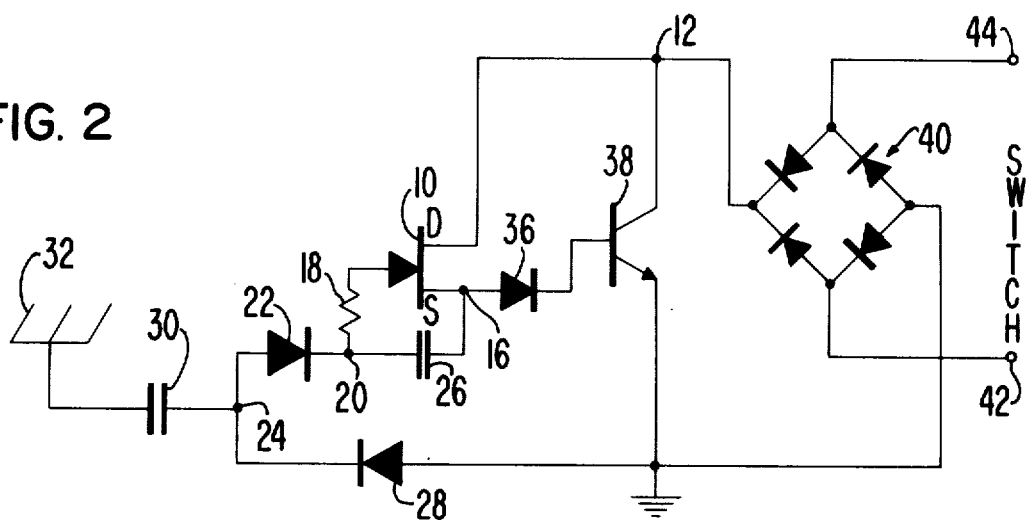
FIG. 2 is a schematic diagram of a second embodiment of the invention for switching both alternating current and direct current.

Referring now more particularly to FIG. 2, the basic switch of FIG. 1 is disclosed with the addition of a power switching device. Throughout this application the same reference numerals will be used for identical elements or, in cases where the original circuit has been modified, the same elements will be given the same reference numerals primed. In this embodiment the output terminal 16, instead of being connected to the circuit ground as in FIG. 1, is connected to the anode of a diode 36 whose cathode is connected to the base electrode of an NPN transistor 38. The collector electrode of the transistor 38 is connected to the output terminal 12 and its emitter electrode is connected to the circuit ground. The anode of the diode 28 is connected to the circuit ground. A diode bridge 40 is connected with the cathodes of the bridge to the output terminal 12 and with the anodes of the bridge connected to the circuit ground. The other two node points of the bridge 40 are connected to separate output terminals 42 and 44. When either alternating current or direct current of any polarity is applied in series with the terminals 42 and 44 the output terminal 12 will be positive with respect to the circuit ground. Thus when the FET 10 is made conductive by sensing an alternating current potential at the antenna 32, as described above in reference to FIG. 1, the source electrode of the transistor 10 will supply a positive bias at the output terminal 16 which is conducted through the diode 36 to the base electrode of the transistor 38. With the application of a positive bias to the base electrode of the transistor 38 it will become conductive, effectively presenting a short circuit in series with the terminals 12, the circuit ground and the bridge 40. Thus with the switching circuit of the embodiment of FIG. 2 both alternating current and direct current of any polarity, and at relatively large magnitudes, may be turned on and off.

Figure 3:
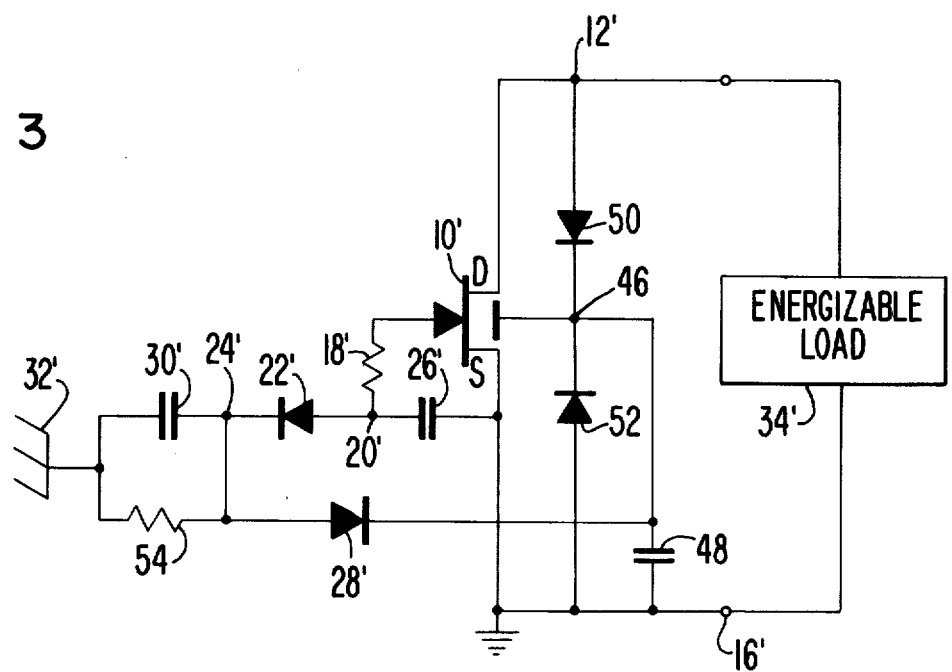
FIG. 3 is a schematic diagram of a third embodiment of the invention for switching low power devices.

Referring now more particularly to FIG. 3, the basic switching circuit of the invention is shown utilizing an N channel MOS FET enhancement mode transistor 10' for detecting moving energy levels of a negative potential. Such as MOS FET is a normally off device. A difference of potential existing between the gate electrode and body, with the gate negative and/or body positive causes it to turn on. An antenna 32' is connected through a capacitor 30' to an input terminal 24'. A resistor 54 is connected in parallel with the capacitor 30'. The cathode of a diode 22' is connected to the input terminal 24' and its anode is connected to a junction point 20' and the gate electrode of the FET 10'. A capacitor 26' is connected between the junction point 20' and the source electrode of the FET 10' which is connected to the circuit ground. A diode 28' is connected with its anode to the input terminal and 24' at its cathode to a junction point 46. A capacitor 48 is connected between the junction point 46 and the circuit ground, which is also the output terminal 16'. A first diode 50 is connected with its anode at the output terminal 12', which is also connected to the drain electrode of the FET 10', and with its cathode connected to the junction point 46. A second diode 52 is connected with its cathode to the junction point 46 and its anode to the circuit ground. An energizable load 34' is connected in series with the terminals 12' and 16'. It will be understood that in all of the descriptions herein an energizable load refers to a load connected in series with a voltage or current source and the switch.

In operation the diodes 50 and 52 are used to bias the body to the most positive state and differences existing at the antenna 32' are coupled through the capacitor 30' and resistor 54 to the input terminal 24'. Positive going alternating current potentials are referenced to the circuit ground by the diode 28' and negative going alternating current potentials are applied to the gate of the FET 10' by means of the diode 22'. The negative going potentials passing through the diode 22' also charge the capacitor 26' negatively to maintain the bias on the gate of the FET 10' through the resistor 18'. When the gate electrode of the FET 10' is negatively biased with respect to the source electrode the FET 10' becomes conductive, thus turning on the energizable load 34'. In all other respects the circuit operates substantially the same as the circuit described with respect to FIG. 1.

Figure 4:
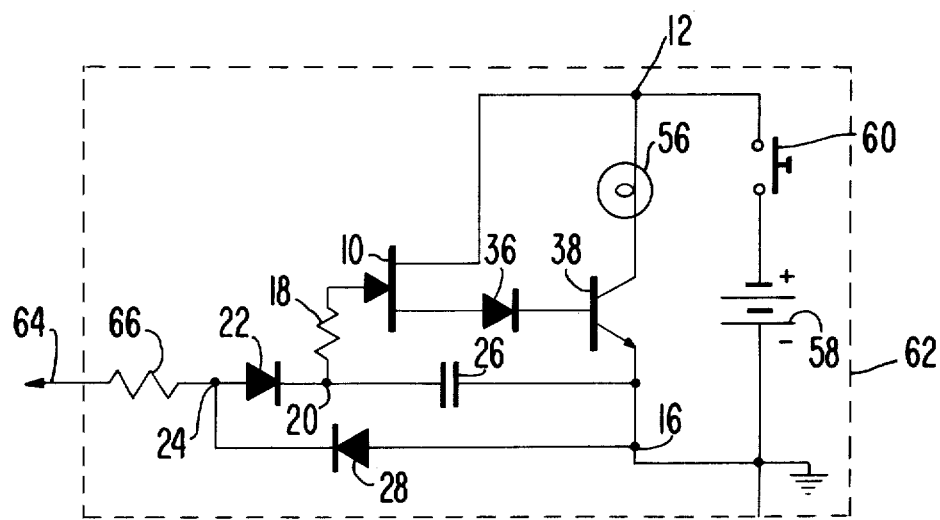
FIG. 4 is a schematic diagram of a fourth embodiment of the invention for activating a light in response to the detection of external energy.
Figure 8:
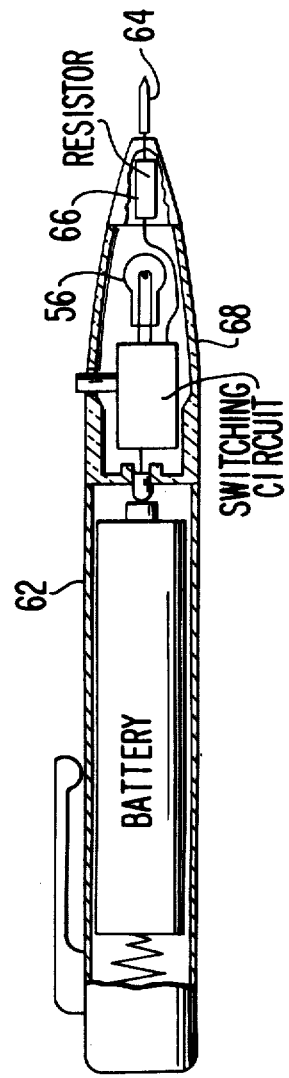
FIG. 8 is a vertical view, partly in section, of a logic probe utilizing the electronic switch of the invention.

Referring now more particularly to FIGS. 4 and 8, an application of a modified switching circuit as suggested by FIGS. 1 and 2 is shown in the form of an energy probe which detects static conditions of a positive potential in excess of 1.5 volts. In this application the electronic switching circuit is housed in a metallic probe body 62 having a projecting tip 64 which is insulated from the body 62. The tip 64 ia connected through a resistor 66 to the input terminal 24. The circuit is substantially the same as depicted in FIG. 2 except that the diode bridge 40 is omitted and a light 56 is connected between the output terminal 12 and the collector electrode of the transistor 38. A battery 58 is connected at its negative terminal to the circuit ground which is also the output terminal 16 and its positive terminal is connected through a push-button switch 60 to the output terminal 12. It should be understood, of course, that the push-button switch 60 in other embodiments may be replaced by the FET switching circuit of FIGS. 1 or 2 and is only shown in push-button form in this Figure for convenience of description and illustration. When a positive potential in excess of 1.5 volts is applied to the tip 64 it is passed through the resistor 66 and the diode 22 to charge the capacitor 26. This, in turn, make the FET 10 conductive and turns on the NPN transistor 38, as described above in reference to FIGS. 1 and 2. Negative going potentials are clamped by the diode 28 to the circuit ground 16. It is assumed in this description that the probe body is held by the operator to form the complete circuit. Thus it is not even necessary that the static potential actually touch the tip and the probe will be activated to turn on the light 56 when the positive potential appears near or on the tip 64.

This energy probe may be used to detect the ungrounded side of ordinary house wiring outlets, to trace Christmas tree series light strings and find the open light, to test for "hot" alternating current wires, to check batteries, to check for voltage in appliances, to troubleshoot computers for logic 1 or 0 level conditions, to troubleshoot automobile electrical circuits, and to check for the anodic index differences between the dock, water and a metal boat hull. Because the probe is battery operated and does not need any external power supplies or wires, it is extraordinarily convenient as a test instrument. It should be pointed out that it is unnecessary to make a direct connection between the probe body and the ground of the circuit under test. This connection is made, in effect, by the high resistance path of the operator's body holding the probe. This is possible because so little current is required to operate the probe.

A property of the energy probe is that of the detection of pain and/or injury and/or disease, as will be shown. Kirlian Photography sets the groundwork for a unique and novel way of measuring and/or detecting pain and/or injury and/or disease. The human body exhibits soft colors, more over a subtle aura, i.e., blue, green, amber, red and yellow. However, when an abnormality is present, i.e., pain, injury or disease, a sharp increase in the energy field is manifested.

Also in the early 1900's, Dr. Walter Kilner of St. Thomas Hospital in London discovered that by looking through glass screens stained with Dicyanin dye, he could see the aura around the human body. According to Kilner, it was a cloud of radiation extending out about 6 to 8 inches and showing distinct colors. Fatigue, diseases, or mood could alter the size and color. Empirical testing shows the energy probe of the invention can detect pain and/or injury and/or disease (as the probe passes over an affected area it lights). Apparently this is due to the increase in energy at the affected area, as indicated above, and is detectable by the high input impedance of the energy probe.

Figure 5A:
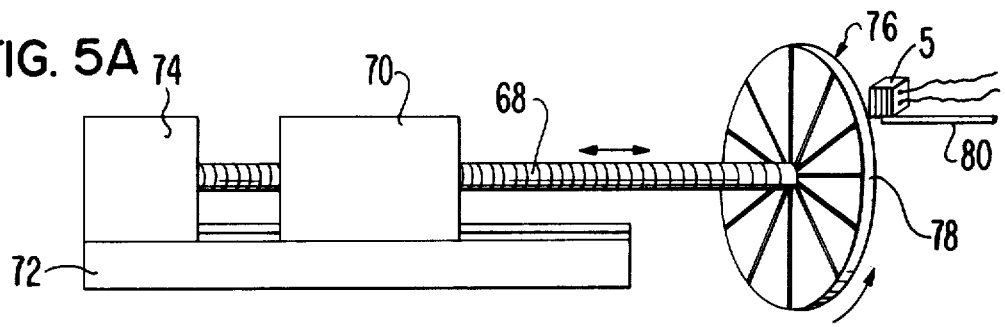
FIGS. 5a and 5b are illustrative diagram showing the application of the electronic switch for sensing the position of a shaft.

Referring now more particularly to FIG. 5a, a screw shaft 68 is threaded through a movable block 70 resting on a horizontal table 72. One end of the screw shaft 68 is rotatably mounted in a bearing block 74 and the other end of the shaft 68 has a spoked wheel 76 mountd thereon. One or more of the spokes 78 of the wheel 76 may be made of rubber or other statically charged material. The electronic switch 5 of the invention is mounted on a stationary support 80 close to the spokes 78 of the wheel 76. As the wheel 76 is rotated the threaded shaft 68 moves the block 70 along the table 72. Switch 5 produces the signal indicating the position of the wheel by means of the static charges on the spokes 78. The signal from the switch 5 thus indicates not only the angular position of the wheel 76 but also the horizontal position of the threaded block 70.

Figure 5B:
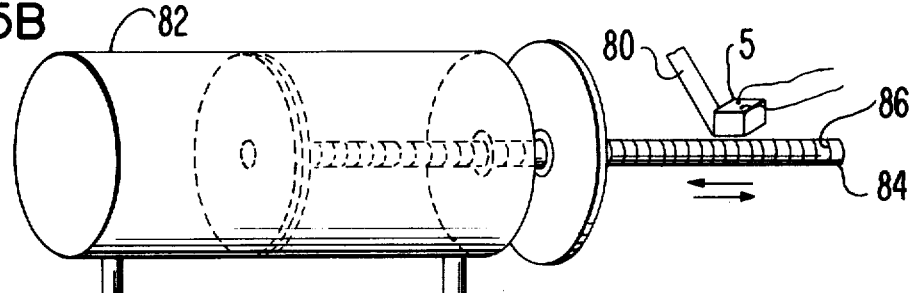

Referring now more particularly to FIG. 5b, a piston cylinder mechanism 82 has an output shaft 84 which has annular bands 86 of charged material. The electronic switch 5 of the invention is mounted on the stationary bracket 80 to be spaced close to the shaft 84. As the shaft 84 is moved longitudinally, as indicated by the directional arrows by the action of the piston cylinder mechanism 82 the switch 5 senses the passage of the annular charged material 86 by it and produces a signal accordingly to indicate the position of the shaft 84.

Figure 6:
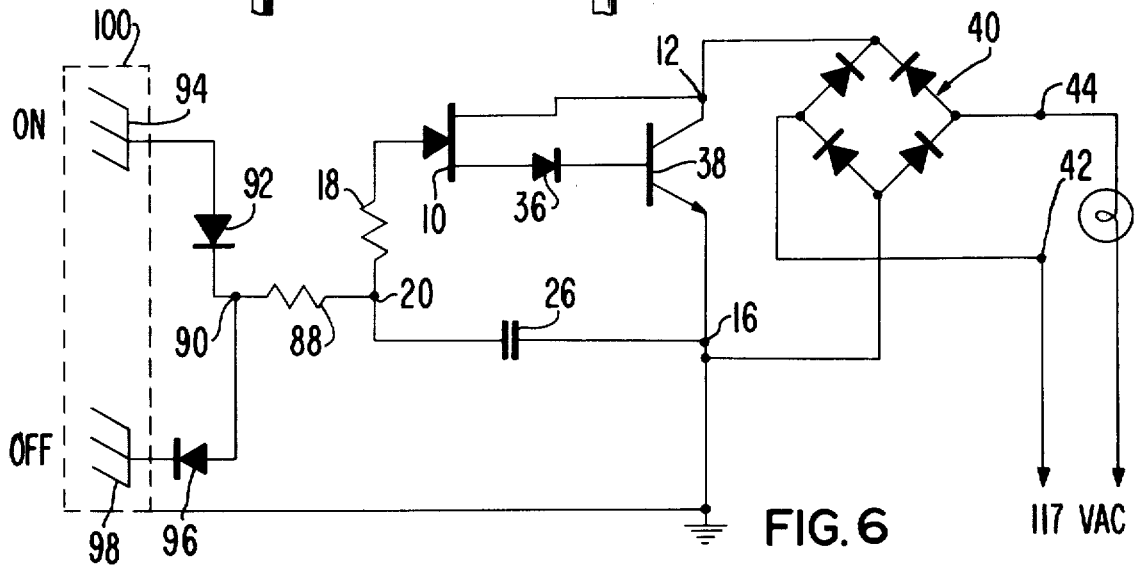
FIG. 6 is a schematic diagram of a bistable switch embodiment of the invention.

In some embodiments it is desirable to have an electronic switch which is bistable; that is, it is stable in either the off or the on condition. Referring now more particularly to FIG. 6, the basic circuit of the embodiments of FIGS. 2 and 4 is modified so that in place of the diodes 22 and 28 and the capacitor 30 a resistor 88 is connected between the junction point 20 and a junction point 90. A diode 92 is connected at its cathode to the junction point 90 and at its anode to an antenna 94. A second diode 96 is connected at its anode to the junction point 90 and at its cathode to a second antenna 98. The antenna 94 is to be considered the "on" antenna, and the antenna 98 is to be considered the "off" antenna. The antennas are shielded by a shield 100 which is connected to the circuit ground at the terminal 16.

In operation the on antenna 94 receives a signal which causes the diode 92 to conduct through the resistor 88 thereby charging the capacitor 26 positively to turn on the FET 10. As explained above in reference to FIG. 2, when an alternating or a direct current is applied across the terminals 42 and 44 a positive potential is applied to the terminal 12 with respect to the terminal 16. When the FET 10 is turned on the transistor 38 becomes conductive with the results and effect of producing the equivalent of a short circuit across the terminals 42 and 44. Thus any load which is connected in series with the source of alternating current or direct current and the electronic switch through the terminals 42 and 44 will be turned on.

The charge produced on the capacitor 26 when the switching device is turned on has no discharge path and thus the charge is on the capacitor to hold the FET 10 in a conductive mode. When the off antenna 98 receives a signal, a negative voltage is supplied through the diode 96 to the capacitor 26 to not only discharge the capacitor 26 but to negatively bias the FET 10 to turn it off and to turn off the transistor 38. When the transistor 38 becomes off or nonconductive the output terminals 42 and 44 present the equivalent of an open circuit to the energizable load. The circuit of FIG. 6 thus has application as a replacement switch for ordinary alternating current appliance switches or light switches or the like.

Figure 7:
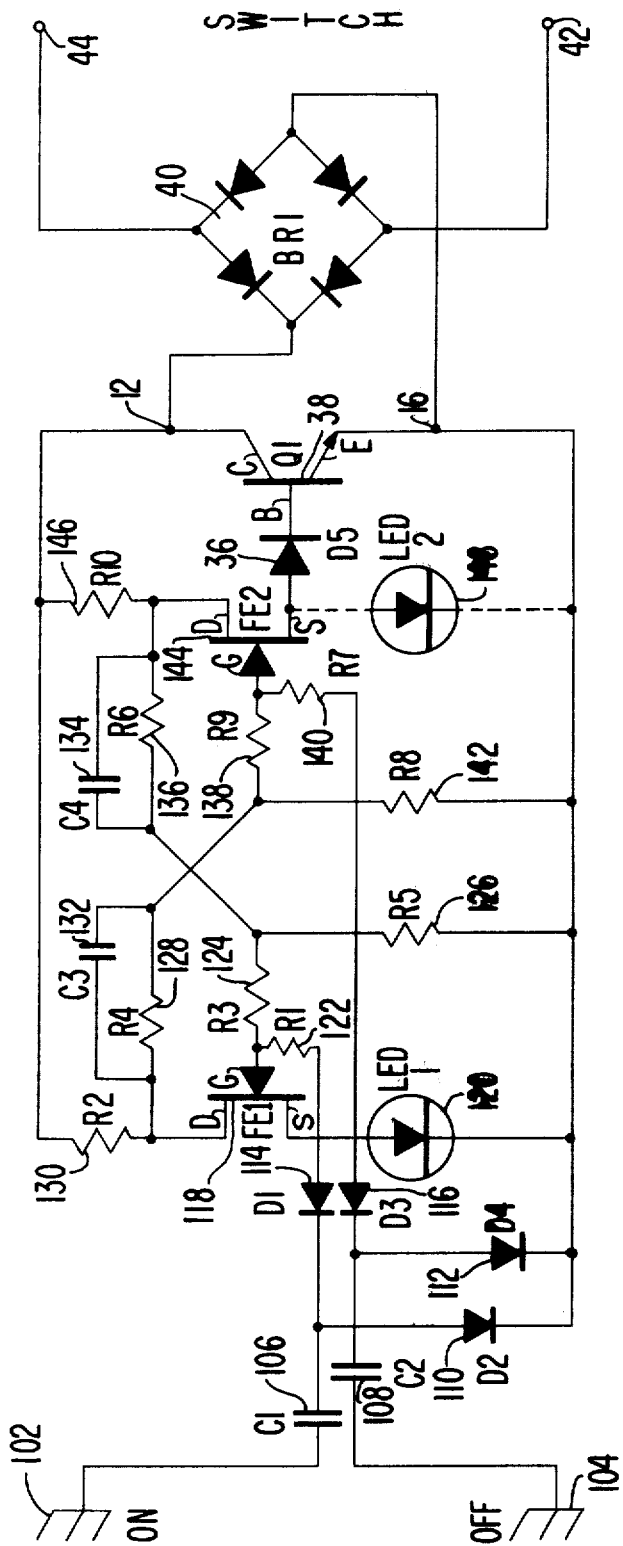
FIG. 7 is a schematic diagram of a bistable logic device using the electronic switch circuit of the invention.

Referring now more particularly to FIG. 7 a bistable flip flop logic element is illustrated which combines two of the electronic switches of the invention. An on antenna 102 is connected through a capacitor 106 to the cathode of a diode 114 and the anode of a diode 110. The cathode of the diode 110 is connected to the circuit ground. The anode of the diode 114 is connected through a resistor 122 to the gate electrode of an FET 118. An off antenna 104 is connected through a capacitor 108 to the cathode of a diode 116 and to the anode of a diode 112. The cathode of the diode 112 is connected to the circuit ground. The anode of the diode 116 is connected through a resistance 140 to a second FET 144 at its gate electrode.

The source electrode of the FET 118 is connected through an LED 120 to the circuit ground. The drain electroce of the FET 118 is connected through a resistance 130 to the terminal 12. The drain electrode of the FET 118 is also connected through a resistance 128 connected in parallel with a capacitor 132 to one end of a resistance 138. The other end of the resistance 138 is connected to the gate electrode of the FET 144.

The gate electrode of the FET 118 is connected through a resistance 124 to a resistor 136 connected in parallel with a capacitor 134 to the drain electrode of the FET 144. The drain electrode of the FET 144 is alos connected through a resistance 146 to the terminal 12. The end of the resistance 124 opposite from the gate electrode of the FET 118 is also connected through a resistor 126 to the circuit ground. Similarly, the other end of the resistance 138 from the gate electrode 144 is connected through a resistance 142 to the circuit ground.

The source electrode of the FET 144 is connected to the anode of the diode 36 whose cathode is connected to the base electrode of the NPN transistor 38. In other respects the remainder of the circuit is similar to the circuit described in reference to FIGS. 2 and 6 and includes the diode bridge 40 and the output terminals 42 and 44. The source electrode of the FET 144 may also be connected through an optional LED 148 to the circuit ground.

In operation, assuming that the switch is turned off, touching the on antenna 102 causes an AC signal to pass through the capacitor 106. The clamping diode 110 references the signal negative, forward biasing the diode 114 to turn the FET 118 off. With the FET 118 off, its drain electrode goes positive through the resistance 130. This increased potential is transferred through the resistance 128 and the capacitor 132 to the junction of the resistances 138 and 142. This, in turn, causes a positive level shift to occur at this junction point with the result that the FET 144 is forward biased. In this condition the drain electrode of the FET 144 goes negative. With the drain electrode of the FET 144 negative, there is a negative level shift at the junction of the resistances 136 and 126, thereby latching the circuit.

With the FET 144 thus being conductive, the diode 36 is forward biased and the transistor 38 shorts the diode bridge 40. As explained above in reference to the circuits of FIGS. 2 and 6 this will turn on the load connected in series with the terminals 44 and 42.

Touching the off antenna 104 reverses the above described operation and latches the switch in the off state. In this off state the impedance is extremely high (about 1M ohms). The circuit of FIG. 7 is a medium power switch, and higher power switching would require a buffer transistor in place of the diode 36.

The FETs 118 and 144 of the circuit depicted in FIG. 7 are MOS FET devices which are normally off. A difference of potential existing between the gate electrode and the body with the gate being positive and/or the body being negative causes the FET to turn on.

While certain applications of the electronic switch of the invention have been described above, the device is in no way limited to these particular applications.

As mentioned above the electronic switch of the invention may be used as a replacement for ordinary on-off mechanical switches. Because of the nature of the switching circuit only a few milliseconds of on and off switching time is required.

The terms and expressions which have been employed here are used as terms of description and not of limitation, and there is no intention, in the use of such terms and expressions, of excluding equivalents of the features shown and described, or portions thereof, it being recognized that various modifications are possible within the scope of the invention claimed.

What is claimed is:

1. An electronic switch for an energizable load, the switch comprising a first high input impedance, field effect transistor (FET) having gate, source and drain electrodes, means for connecting the energizable load in series with the source and drain electrodes, and diode input means having a first input terminal, a circuit ground and being connected between the gate and source electrodes for normally making the first FET nonconductive by ensuring that in the absence of an input signal between the first input terminal and the circuit ground the source electrode is at a potential with respect to the gate electrode which reverse biases the gate electrode and for making the first FET conductive when an input signal of a predetermined magnitude is applied between the first input terminal and the circuit ground, the diode means further including a first resistor connected at one end to the gate electrode, and at the other end to a junction point, a first diode having its anode connected to the first input terminal and its cathode connected to the junction point, a first capacitor connected between the junction point and the source electrode, and a second diode having its cathode connected to the anode of the first diode and its anode connected to the end of the capacitor which is connected to the source electrode.

2. An electronic switch as recited in claim 1 further comprising an antenna and a second capacitor connected in series between the antenna and the first input terminal for picking up electrical energy external to the switch.

3. An electronic switch as recited in claim 1, wherein the energizable load is an indicator and further comprising an electrically conductive housing for the switch, the housing being connected to the circuit ground, an electrically conductive tip, the tip being electrically connected to the first input terminal of the diode means, and electrical insulating means for mounting the tip on the housing, whereby when the housing is hand held by the operator the indicator will be energized when a predetermined voltage is applied to the tip.

4. An electronic switch for an energizable load, the switch comprising a first high input impedance, field effect transistor (FET) having gate, source and drain electrodes, means for connecting the energizable load in series with the source and drain electrodes, and diode input means having a first input terminal, a circuit ground and being connected between the gate and source electrodes for normally making the first FET nonconductive by ensuring that in the absence of an input signal between the first input terminal and the circuit ground the source electrode is at a potential with respect to the gate electrode which reverse biases the gate electrode and for making the first FET conductive when an input signal of a predetermined magnitude is applied between the first input terminal and the circuit ground, the diode means further including a resistor connected between the first FET's gate electrode and a junction point, a capacitor connected between the junction point and the first FET's source electrode, first and second antennas, a first diode connected at its anode to the first antenna and at its cathode to the junction point, and a second diode connected at its cathode to the second antenna and at its anode to the junction point, whereby the first FET is bistably conductive and non-conductive in response to the application of electrical potential alternately to the first and second antennas.

5. An electronic switch for an energizable load, the switch comprising a first high input impedance, field effect transistor (FET) having gate, source and drain electrodes, means for connecting the energizable load in series with the source and drain electrodes, diode input means having a first input terminal, a circuit ground and being connected between the gate and source electrodes for normally making the first FET non-conductive by ensuring that in the absence of an input signal between the first input terminal and the circuit ground the source electrode is at a potential with respect to the gate electrode which reverse biases the gate electrode and for making the first FET conductive when an input signal of a predetermined magnitude is applied between the first input terminal and the circuit ground, and second transistor means connected to the source and drain electrodes of the first FET and which becomes conductive when the first FET is conductive and non-conductive when the first FET is nonconductive, the second transistor means having a pair of output terminals, and a full wave diode bridge having an anode terminal, a cathode terminal and separate midnode terminals connected between the anode and the cathode terminals, the bridge being connected at its anode and cathode terminals to the output terminals of the second transistor means whereby an electrical potential from an external source applied in series with the midnodes of the diode bridge will be turned on or off depending on the conductivity state of the first FET.

6. An electronic switch for an energizable load, the switch comprising a first high input impedance, field effect transistor (FET) having gate, source and drain electrodes, means for connecting the energizable load in series with the source and drain electrodes, and diode input means having a first input terminal, a circuit ground and being connected between the gate and source electrodes for normally making the first FET non-conductive by ensuring that in the absence of an input signal between the first input terminal and the circuit ground the source electrode is at a potential with respect to the gate electrode which reverse biases the gate electrode and for making the first FET conductive when an input signal of a predetermined magnitude is applied between the first input terminal and the circuit ground, the diode input means further including a second, high input impedance, field effect transistor (FET) having gate, source and drain electrodes, a second input terminal, and latching circuit means connecting together the second FET, the second input terminal and the first FET and for normally biasing the first FET to be conductive after an input signal of a predetermined magnitude is applied between the first input terminal and the circuit ground and until an input signal of a predetermined magnitude is applied between the second input terminal and the circuit ground.

7. An electronic switch for an energizable load, the switch comprising an N channel, metal oxide semiconductor, enhancement mode field effect transistor (FET) having a body, gate, source and drain electrodes, means for connecting the energizable load in series with the source and drain electrodes, a first diode connected at its anode to the source electrode, a second diode connected at its anode to the drain electrode, the first and second diodes being connected at their cathodes to the FET body, a first capacitor connected between the FET body and the source electrode, and diode input means having a first input terminal, a circuit ground and being connected between the gate electrode and the FET body for making the FET conductive when a negative polarity input signal of a predetermined magnitude is applied between the first input terminal and the circuit ground, the diode input means further including a first resistor connected at one end to the gate electrode, and at the other end to a first junction point, a third diode having its cathode connected to a second junction point and its anode connected to the first junction point, a second capacitor connected between the first junction point and the source electrode, a fourth diode having its anode connected to the cathode of the third diode and its cathode connected to the end of the first capacitor which is connected to the FET body, and third capacitor and a second resistor connected in parallel between the input terminal and the second junction point.

* * * * *